(12) United States Patent
Chow et al.

(10) Patent No.: US 8,106,500 B2
(45) Date of Patent: Jan. 31, 2012

(54) STACKABLE INTEGRATED CIRCUIT PACKAGE SYSTEM

(75) Inventors: Seng Guan Chow, Singapore (SG); Heap Hoe Kuan, Singapore (SG); Dioscoro A. Merilo, Singapore (SG); Antonio B. Dimaano, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 75 days.

(21) Appl. No.: 12/777,023

(22) Filed: May 10, 2010

(65) Prior Publication Data
US 2010/0219523 A1 Sep. 2, 2010

Related U.S. Application Data

(62) Division of application No. 11/307,906, filed on Feb. 27, 2006, now Pat. No. 7,741,707.

(51) Int. Cl.
*H01L 23/02* (2006.01)
(52) U.S. Cl. .................. 257/686; 257/777
(58) Field of Classification Search ............. 257/686, 257/777, E25.027
See application file for complete search history.

(56) References Cited

U.S. PATENT DOCUMENTS

| 5,811,132 | A | 9/1998 | Rho et al. |
|---|---|---|---|
| 6,731,009 | B1 | 5/2004 | Jones et al. |
| 6,781,243 | B1 | 8/2004 | Li et al. |
| 6,798,057 | B2 | 9/2004 | Bolkin et al. |
| 6,977,440 | B2 | 12/2005 | Pflughaupt et al. |
| 6,982,488 | B2 | 1/2006 | Shin et al. |
| 7,348,211 | B2 | 3/2008 | Lin et al. |
| 2004/0159955 | A1 | 8/2004 | Shen |
| 2005/0051890 | A1* | 3/2005 | Zhang et al. .......... 257/712 |

* cited by examiner

*Primary Examiner* — Bradley K Smith
(74) *Attorney, Agent, or Firm* — Mikio Ishimaru

(57) ABSTRACT

A stackable integrated circuit package system includes: a substrate having a first side and a second side opposite the first side, the substrate having a cavity provided therein; a first integrated circuit die in the cavity with a first interconnect extending out from the cavity without connection and a second interconnect connected to the first side; a first mold compound to cover the first integrated circuit die, the second interconnect, and a portion of the first interconnect; a second integrated circuit die mounted to the first integrated circuit die with a third interconnect connected to the second side; a second mold compound to cover the second integrated circuit die and the third interconnect; and external interconnects, not encapsulated by the second encapsulant, mounted on the second side.

10 Claims, 6 Drawing Sheets

STACKABLE INTEGRATED CIRCUIT PACKAGE SYSTEM

CROSS-REFERENCE TO RELATED APPLICATION(S)

This is a divisional of U.S. patent application Ser. No. 11/307,906 filed Feb. 27, 2006.

TECHNICAL FIELD

The present invention relates generally to integrated circuit packages and more particularly to a stackable integrated circuit package system.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

In response to the demands for improved packaging, many innovative package designs have been conceived and brought to market. The multi-chip module has achieved a prominent role in reducing the board space used by modern electronics. However, multi-chip modules, whether vertically or horizontally arranged, can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

Numerous package approaches stack multiple integrated circuits, package level stacking, or package on package (POP). KGD and assembly process yields are not an issue since each package can be tested prior to assembly, allowing KGD to be used in assembling the stack. But stacking integrated devices, package-on-package, or a combination thereof has assembly process difficulties caused by these packages having limited input and output (I/O). Current packages also do not provide the flexibility to support the various integration and stacking options described earlier with the higher I/O count support.

Thus, a need still remains for a stackable integrated circuit package system providing low cost manufacturing, improved yields, reduce the integrated circuit package dimensions and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable integrated circuit package system including: a substrate having a first side and a second side opposite the first side, the substrate having a cavity provided therein; a first integrated circuit die in the cavity with a first interconnect extending out from the cavity without connection and a second interconnect connected to the first side; a first mold compound to cover the first integrated circuit die, the second interconnect, and a portion of the first interconnect; a second integrated circuit die mounted to the first integrated circuit die with a third interconnect connected to the second side; a second mold compound to cover the second integrated circuit die and the third interconnect; and external interconnects, not encapsulated by the second encapsulant, mounted on the second side.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Figure 1:
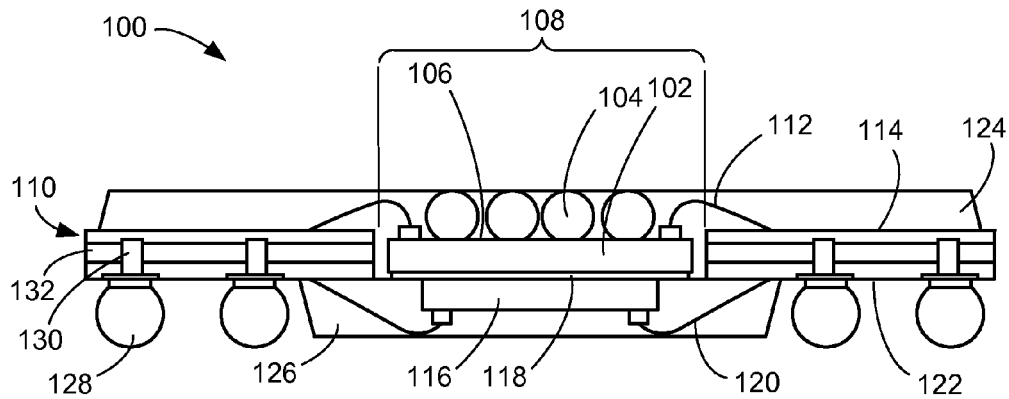
FIG. 1 is a cross-sectional view of a first stackable integrated circuit package system in an embodiment of the present invention.

Referring now to FIG. 1, therein is shown a cross-sectional view of a first stackable integrated circuit package system 100 in an embodiment of the present invention. A first integrated circuit die 102, such as a flip chip or a bumped chip, has first interconnects 104, such as solder bumps, on a first active side 106. The first integrated circuit die 102 is located in a cavity 108 of a substrate 110, such as an organic or inorganic substrate, with the first interconnects 104 extending out from the cavity 108 without connection. Second interconnects 112, such as bond wires, are electrically connected between the first integrated circuit die 102 and a first side 114 of the substrate 110. A second integrated circuit die 116 is attached to a first non-active side 118 of the first integrated circuit die 102. Third interconnects 120, such as bond wires, are electrically connected between the second integrated circuit die 116 and a second side 122 of the substrate 110.

A first mold compound 124, such as an epoxy mold compound (EMC), encapsulates the first integrated circuit die 102 and the second interconnects 112 and fills the cavity 108. The first mold compound 124 also surrounds and exposes the first interconnects 104 for further connections. The first side 114 is substantially covered by the first mold compound 124.

A second mold compound 126, such as an epoxy mold compound (EMC), encapsulates the second integrated circuit die 116 and the third interconnects 120. The second mold compound 126 forms a hermetic seal with the first mold compound 124 for the first integrated circuit die 102 and the second integrated circuit die 116. The second mold compound 126 covers the second side 122 near the cavity 108. External interconnects 128, such as solder balls, are attached to the second side 122 and not encapsulated by the second mold compound 126. The first mold compound 124 and the second mold compound 126 may be the same material or may be different.

The substrate 110 has bond sites (not shown) in the first side 114 and the second side 122 for connections with the second interconnects 112 and the third interconnects 120, respectively. The bond sites in the first side 114 are part of a conductive layer (not shown) of the first side 114. Similarly, the bond sites in the second side 122 are part of another conductive layer (not shown) of the second side 122. Electrical vias 130 connect the conductive layers at predetermined locations. An insulator layer 132, such as a dielectric layer, surrounds the electrical vias 130 and separates the conductive layers.

Figure 2:
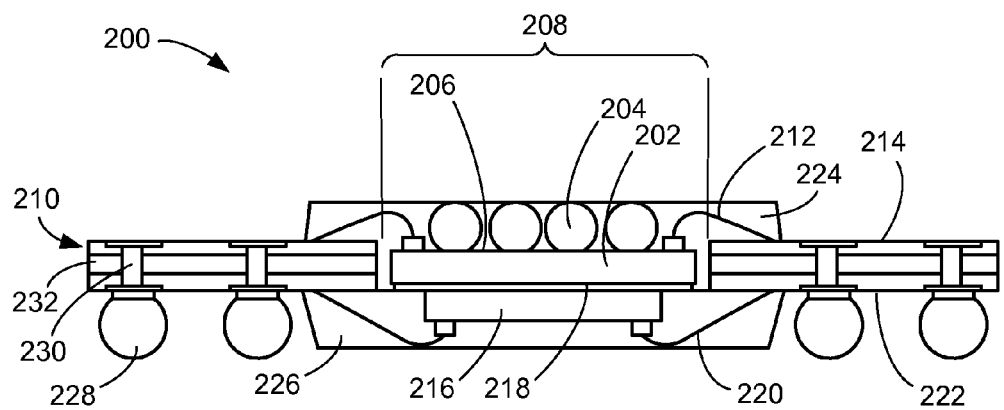
FIG. 2 is a cross-sectional view of a second stackable integrated circuit package system in an alternative embodiment of the present invention.

Referring now to FIG. 2, therein is shown a cross-sectional view of a second stackable integrated circuit package system 200 in an alternative embodiment of the present invention. A first integrated circuit die 202, such as a flip chip or a bumped chip, has first interconnects 204, such as solder bumps, on a first active side 206. The first integrated circuit die 202 is located in a cavity 208 of a substrate 210, such as an organic or inorganic substrate. Second interconnects 212, such as bond wires, is attached between the first integrated circuit die 202 and a first side 214 of the substrate 210. A second integrated circuit die 216 is attached to a first non-active side 218 of the first integrated circuit die 202. Third interconnects 220, such as bond wires, are attached between the second integrated circuit die 216 and a second side 222 of the substrate 210.

A first mold compound 224, such as an epoxy mold compound (EMC), encapsulates the first integrated circuit die 202 and the second interconnects 212 and fills the cavity 208. The first mold compound 224 also surrounds and exposes the first interconnects 204 for further connections. The first mold compound 224 covers the first side 214 proximate the cavity 208.

A second mold compound 226, such as an epoxy mold compound (EMC), encapsulates the second integrated circuit die 216 and the third interconnects 220. The second mold compound 226 forms a hermetic seal with the first mold compound 224 for the first integrated circuit die 202 and the second integrated circuit die 216. The second mold compound 226 covers the second side 222 near the proximity of the cavity 208 and does not obstruct external interconnects 228, such as solder balls, attached to the second side 222. The first mold compound 224 and the second mold compound 226 may be the same material or may be different.

The substrate 210 has bond sites (not shown) in the first side 214 and the second side 222 for connections with the second interconnects 212 and the third interconnects 220, respectively. The bond sites in the first side 214 are part of a conductive layer (not shown) of the first side 214. Similarly, the bond sites in the second side 222 are part of another conductive layer (not shown) of the second side 222. Electrical vias 230 connect the conductive layers at predetermined locations. An insulator layer 232, such as a dielectric layer, surrounds the electrical vias 230 and separates the conductive layers.

Figure 3:
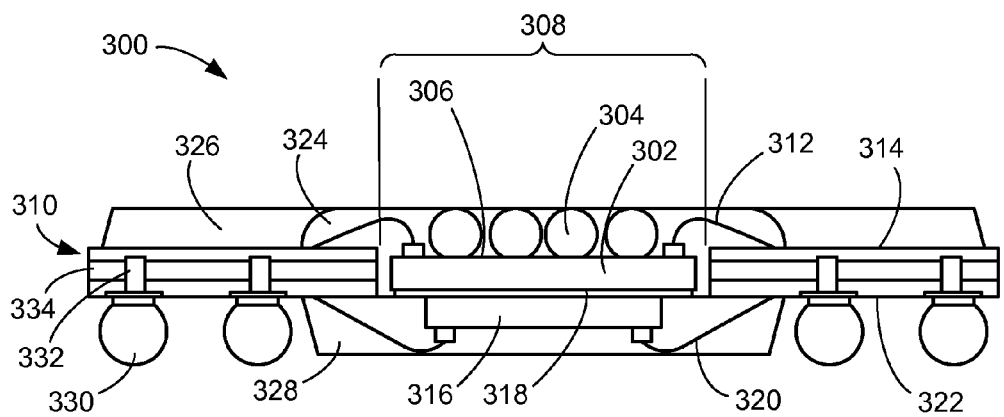
FIG. 3 is a cross-sectional view of a third stackable integrated circuit package system in another alternative embodiment of the present invention.

Referring now to FIG. 3, therein is shown a cross-sectional view of a third stackable integrated circuit package system 300 in another alternative embodiment of the present invention. A first integrated circuit die 302, such as a flip chip or a bumped chip, has first interconnects 304, such as solder bumps, on a first active side 306. The first integrated circuit die 302 is located in a cavity 308 of a substrate 310, such as an organic or inorganic substrate. Second interconnects 312, such as bond wires, is attached between the first integrated circuit die 302 and a first side 314 of the substrate 310. A second integrated circuit die 316 is attached to a first non-active side 318 of the first integrated circuit die 302. Third interconnects 320, such as bond wires, are attached between the second integrated circuit die 316 and a second side 322 of the substrate 310.

An encapsulant 324, such as a glob top, covers the first integrated circuit die 302 and the second interconnects 312 and fills the cavity 308. The encapsulant 324 also surrounds and exposes the first interconnects 304 for further connections. The first side 314 is substantially covered by the encapsulant 324. The encapsulant 324 covers the first side 314 proximate the cavity 308. The encapsulant 324 provides stress relief.

A first mold compound 326, such as an epoxy mold compound (EMC), surrounds and exposes the encapsulant 324 while leaving the first interconnects 304 exposed for further connections. The first side 314 is substantially covered by the first mold compound 326.

A second mold compound 328, such as an epoxy mold compound (EMC), encapsulates the second integrated circuit die 316 and the third interconnects 320. The second mold compound 328 forms a hermetic seal with the first mold compound 326 for the first integrated circuit die 302 and the second integrated circuit die 316. The second mold compound 328 covers the second side 322 near the proximity of the cavity 308 and does not obstruct external interconnects 330, such as solder balls, attached to the second side 322. The first mold compound 326 and the second mold compound 328 may be the same material or may be different.

The substrate 310 has bond sites (not shown) in the first side 314 and the second side 322 for connections with the second interconnects 312 and the third interconnects 320, respectively. The bond sites in the first side 314 are part of a conductive layer (not shown) of the first side 314. Similarly, the bond sites in the second side 322 are part of another conductive layer (not shown) of the second side 322. Electrical vias 332 connect the conductive layers at predetermined locations. An insulator layer 334, such as a dielectric layer, surrounds the electrical vias 332 and separates the conductive layers.

Figure 4:
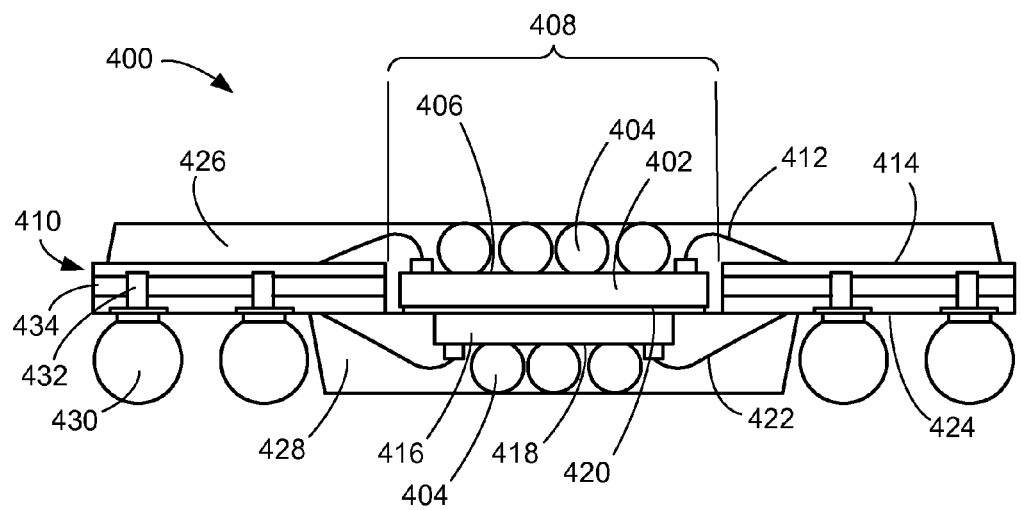
FIG. 4 is a cross-sectional view of a fourth stackable integrated circuit package system in yet another alternative embodiment of the present invention.

Referring now to FIG. 4, therein is shown a cross-sectional view of a fourth stackable integrated circuit package system 400 in yet another alternative embodiment of the present invention. A first integrated circuit die 402, such as a flip chip or a bumped chip, has first interconnects 404, such as solder bumps, on a first active side 406. The first integrated circuit die 402 is located in a cavity 408 of a substrate 410, such as an organic or inorganic substrate. Second interconnects 412, such as bond wires, is attached between the first integrated circuit die 402 and a first side 414 of the substrate 410.

A second integrated circuit die 416, such as a flip chip or a bumped chip, has the first interconnects 404, such as solder bumps, on a second active side 418. The second integrated circuit die 416 is attached to a first non-active side 420 of the first integrated circuit die 402. Third interconnects 422, such as bond wires, is attached between the second integrated circuit die 416 and a second side 424 of the substrate 410.

A first mold compound 426, such as an epoxy mold compound (EMC), encapsulates the first integrated circuit die 402 and the second interconnects 412 and fills the cavity 408. The first mold compound 426 also surrounds and exposes the first interconnects 404 for further connections. The first side 414 is substantially covered by the first mold compound 426.

A second mold compound 428, such as an epoxy mold compound (EMC), encapsulates the second integrated circuit die 416 and the third interconnects 422. The second mold compound 428 also surrounds and exposes the first interconnects 404 of the second integrated circuit die 416 for further connections. The second mold compound 428 forms a hermetic seal with the first mold compound 426 for the first integrated circuit die 402 and the second integrated circuit die 416. The second mold compound 428 covers the second side 424 near the proximity of the cavity 408 and does not obstruct external interconnects 430, such as solder balls, attached to the second side 424. The first mold compound 426 and the second mold compound 428 may be the same material or may be different.

The substrate 410 has bond sites (not shown) in the first side 414 and the second side 424 for connections with the second interconnects 412 and the third interconnects 422, respectively. The bond sites in the first side 414 are part of a conductive layer (not shown) of the first side 414. Similarly, the bond sites in the second side 424 are part of another conductive layer (not shown) of the second side 424. Electrical vias 432 connect the conductive layers at predetermined locations. An insulator layer 434, such as a dielectric layer, surrounds the electrical vias 432 and separates the conductive layers.

Figure 5:
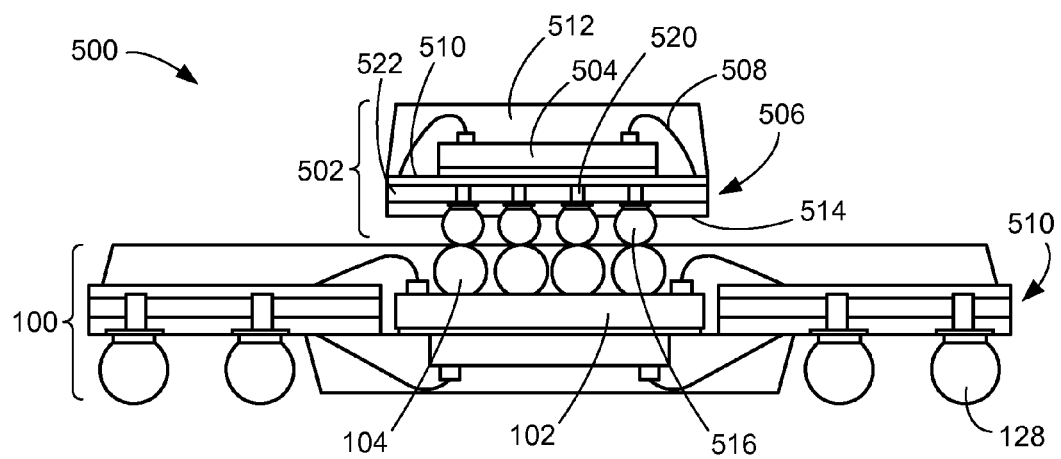
FIG. 5 is a cross-sectional view of a first integrated circuit package-on-package system having the first stackable integrated circuit package system.

Referring now to FIG. 5, therein is shown a cross-sectional view of a first integrated circuit package-on-package system 500 having the first stackable integrated circuit package system 100. A top package 502, such as a leaded, arrayed, system in package (SIP), leadless, or stacked integrated circuit package, is mounted on the first stackable integrated circuit package system 100.

The top package 502 has a top integrated circuit die 504 mounted on a top substrate 506. Top internal interconnects 508, such as bond wires, is attached between the top integrated circuit die 504 and a top side 510 of the top substrate 506. A top mold compound 512 encapsulates the top integrated circuit die 504 and the top internal interconnects 508 to the top side 510.

The top substrate 506 has bond sites (not shown) in the top side 510 and a bottom side 514 of the top substrate 506 for connections with the top internal interconnects 508 and top external interconnects 516, respectively. The top external interconnects 516 is attached to the first interconnects 104. The bond sites in the top side 510 are part of a conductive layer (not shown) of the top side 510. Similarly, the bond sites in the bottom side 514 are part of another conductive layer (not shown) of the bottom side 514. Electrical vias 520 connect the conductive layers at predetermined locations. An insulator layer 522, such as a dielectric layer, surrounds the electrical vias 520 and separates the conductive layers.

The first integrated circuit die 102 may direct signals from the top package 502 to circuitry (not shown) of the first integrated circuit die 102 and subsequently to the next system level (not shown), such as a printed circuit board, using flex-on-chip (FOC) technology. The first integrated circuit die 102 may provide signal routing from the top package 502 on the first stackable integrated circuit package system 100 to the next system level in a daisy chain transmission using redistribution layer (RDL) technology serving as a dummy substrate/interposer. The first integrated circuit die 102 further provides signal routing from the top package 502 on the first stackable integrated circuit package system 100, via circuitry of the first integrated circuit die 102, to the next system level using RDL technology.

Figure 6:
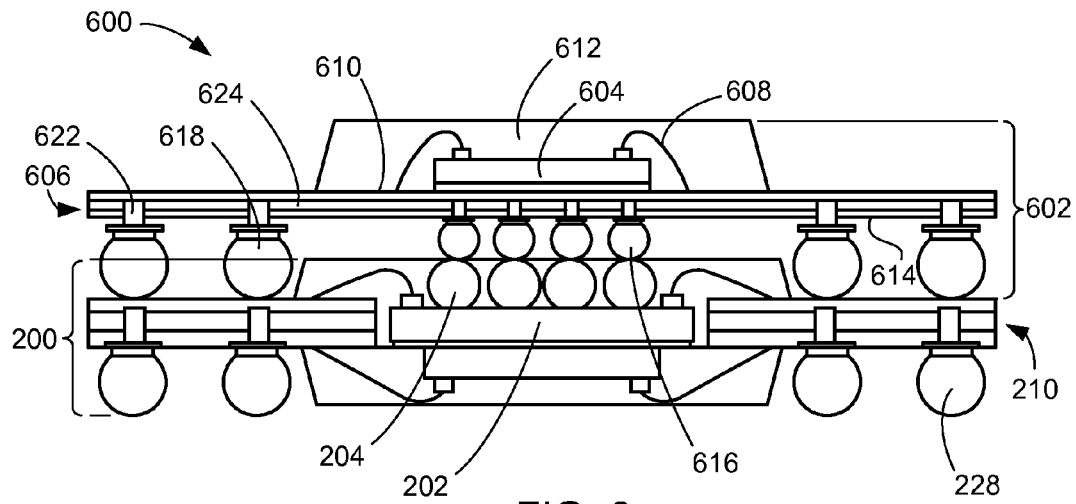
FIG. 6 is a cross-sectional view of a second integrated circuit package-on-package system having the second stackable integrated circuit package system.

Referring now to FIG. 6, therein is shown a cross-sectional view of a second integrated circuit package-on-package system 600 having the second stackable integrated circuit package system 200. A top package 602, such as a leaded, arrayed, system in package (SIP), leadless, or stacked integrated circuit package, is mounted on the second stackable integrated circuit package system 200.

The top package 602 has a top integrated circuit die 604 mounted on a top substrate 606. Top internal interconnects 608, such as bond wires, is attached between the top integrated circuit die 604 and a top side 610 of the top substrate 606. A top mold compound 612 encapsulates the top integrated circuit die 604 and the top internal interconnects 608 to the top side 610.

The top substrate 606 has bond sites (not shown), in the top side 610 of the top substrate 606, for connections with the top internal interconnects 608. The top substrate 606 has bond sites (not shown) in a bottom side 614 of the top substrate 606 for connections with first top external interconnects 616 and second top external interconnects 618. The first top external interconnects 616 is attached to the first interconnects 204. The second top external interconnects 618 is attached to the substrate 210 of the second stackable integrated circuit package system 200.

The bond sites in the top side 610 are part of a conductive layer (not shown) of the top side 610. Similarly, the bond sites in the bottom side 614 are part of another conductive layer (not shown) of the bottom side 614. Electrical vias 622 connect the conductive layers at predetermined locations. An insulator layer 624 such as a dielectric layer, surrounds the electrical vias 622 and separates the conductive layers.

The first integrated circuit die 202 may direct signals from the top package 602 to circuitry (not shown) of the first integrated circuit die 202 and subsequently to the next system level (not shown), such as a printed circuit board, using flex-on-chip (FOC) technology. The first integrated circuit die 202 may provide signal routing from the top package 602 on the second stackable integrated circuit package system 200 to the next system level in a daisy chain transmission using redistribution layer (RDL) technology serving as a dummy substrate/interposer. The first integrated circuit die 202 further provides signal routing from the top package 602 on the second stackable integrated circuit package system 200, via circuitry of the first integrated circuit die 202, to the next system level using RDL technology.

Figure 7:
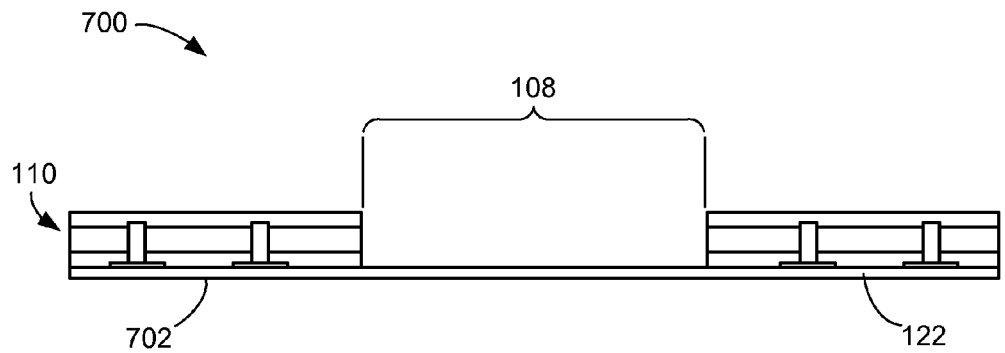
FIG. 7 is a cross-sectional view of the substrate in a pre-die-attach phase.

Referring now to FIG. 7, therein is shown a cross-sectional view of a substrate structure 700 in an embodiment of the present invention. The cross-sectional view depicts an instance of the substrate 110 of the substrate structure 700. A protective tape 702 is attached to the second side 122 of the substrate 110. The protective tape 702 has sufficient structural rigidity to remain planar under the cavity 108.

Figure 8:
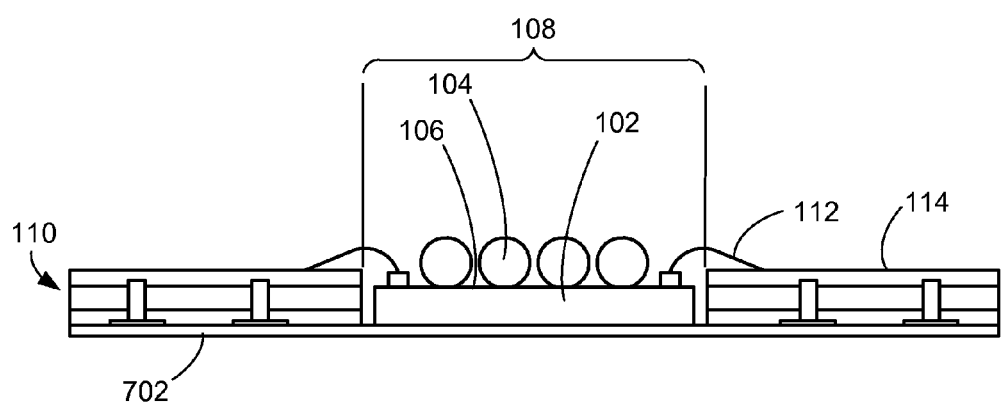
FIG. 8 is the structure of FIG. 7 in a first die-attach phase.

Referring now to FIG. 8, therein is shown the structure of FIG. 7 in a first die-attach phase. The first integrated circuit die 102 having the first interconnects 104 thereon is placed in the cavity 108 and attached to the protective tape 702. The second interconnects 112 are attached between the first side 114 of the substrate 110 and the first active side 106 of the first integrated circuit die 102.

Figure 9:
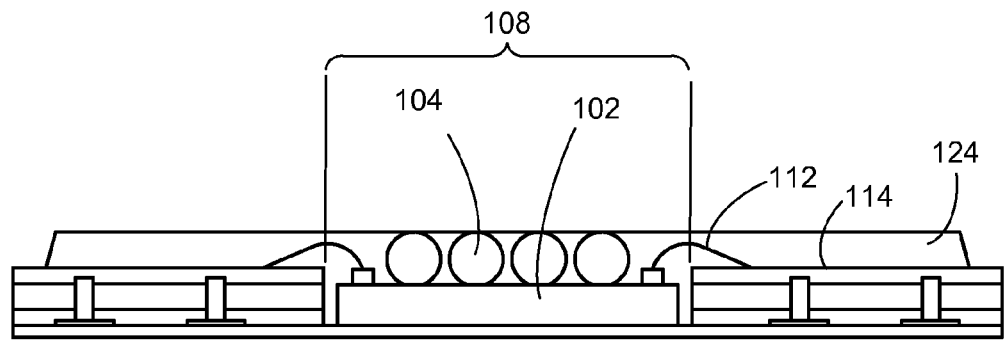
FIG. 9 is the structure of FIG. 8 in a first encapsulation phase.

Referring now to FIG. 9, therein is shown the structure of FIG. 8 in a first encapsulation phase. The first mold compound 124 encapsulates the first integrated circuit die 102, the first interconnects 104, and the second interconnects 112 as well as fills the cavity 108. The first interconnects 104 may be exposed with a number of processes, such as a film assist molding or a chemical mechanical planarization (CMP). The first side 114 is substantially covered by the first mold compound 124.

Figure 10:
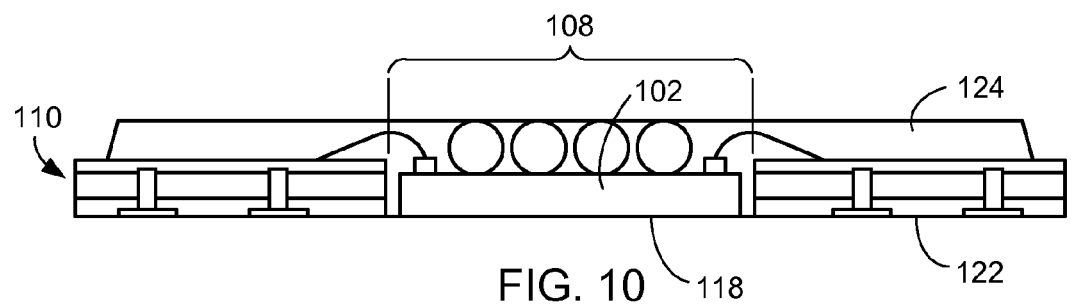
FIG. 10 is the structure of FIG. 9 in a tape removal phase.

Referring now to FIG. 10, therein is shown the structure of FIG. 9 in a tape removal phase. The protective tape 702 is removed exposing the first non-active side 118 of the first integrated circuit die 102 and the second side 122 of the substrate 110 for further processing. The first mold compound 124 holds the first integrated circuit die 102 in the cavity 108.

Figure 11:
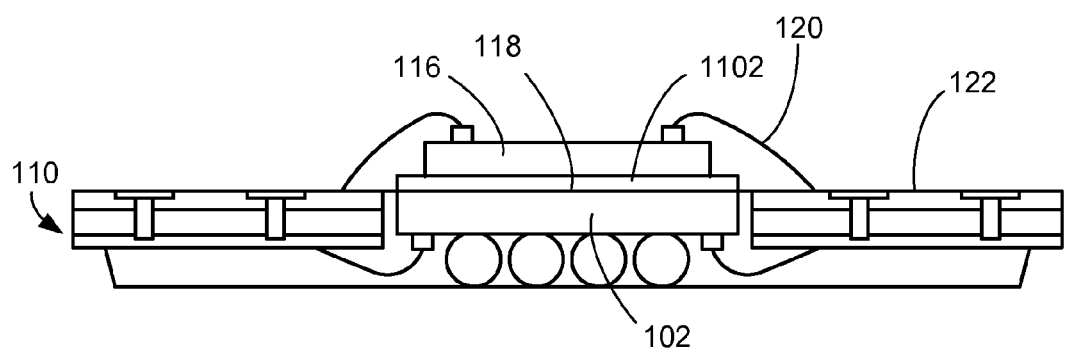
FIG. 11 is the structure of FIG. 10 a second die-attach phase.

Referring now to FIG. 11, therein is shown the structure of FIG. 10 a second die-attach phase. The second integrated circuit die 116 is attached on a die-attach material 1102, such as an adhesive, on the first non-active side 118 of the first integrated circuit die 102. The third interconnects 120 are attached between the second integrated circuit die 116 and the second side 122 of the substrate 110.

Figure 12:
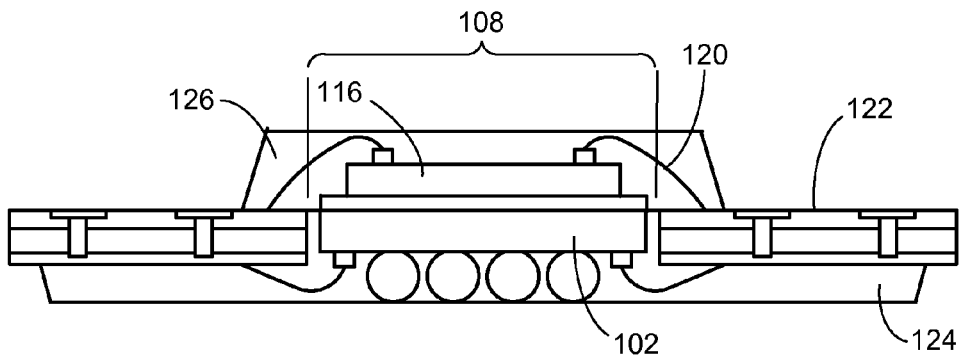
FIG. 12 is the structure of FIG. 11 in a second encapsulation phase.

Referring now to FIG. 12, therein is shown the structure of FIG. 11 in a second encapsulation phase. The second mold compound 126 forms a center gate mold and encapsulates the second integrated circuit die 116 and the third interconnects 120. The second mold compound 126 forms a hermetic seal with the first mold compound 124 for the first integrated circuit die 102 and the second integrated circuit die 116. The second mold compound 126 covers the second side 122 near the proximity of the cavity 108 and does not obstruct the external interconnects 128 of FIG. 1 attached to the second side 122.

Figure 13:
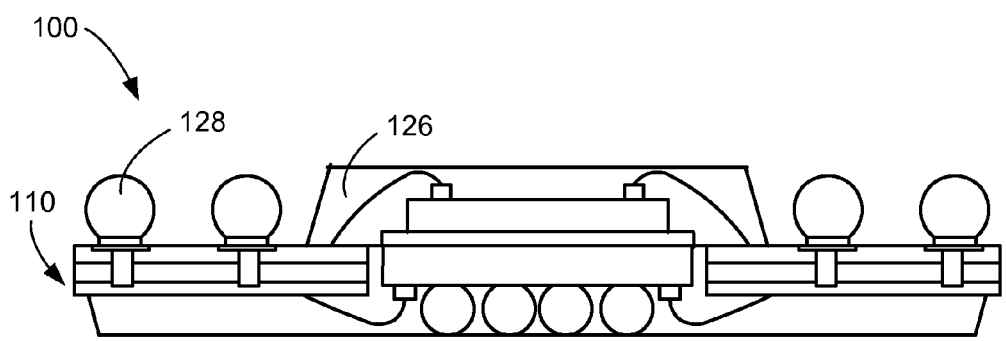
FIG. 13 is the structure of FIG. 12 in an external connectivity attach phase.

Referring now to FIG. 13, therein is shown the structure of FIG. 12 in an external connectivity attach phase. The external interconnects 128 may be attached to the second side of the substrate 110. The height of the second mold compound 126 does not impede connections of the external interconnects 128 to the next system level, such as a printed circuit board. After attachment of the external interconnects 128, singulation provides the first stackable integrated circuit package system 100.

Figure 14:
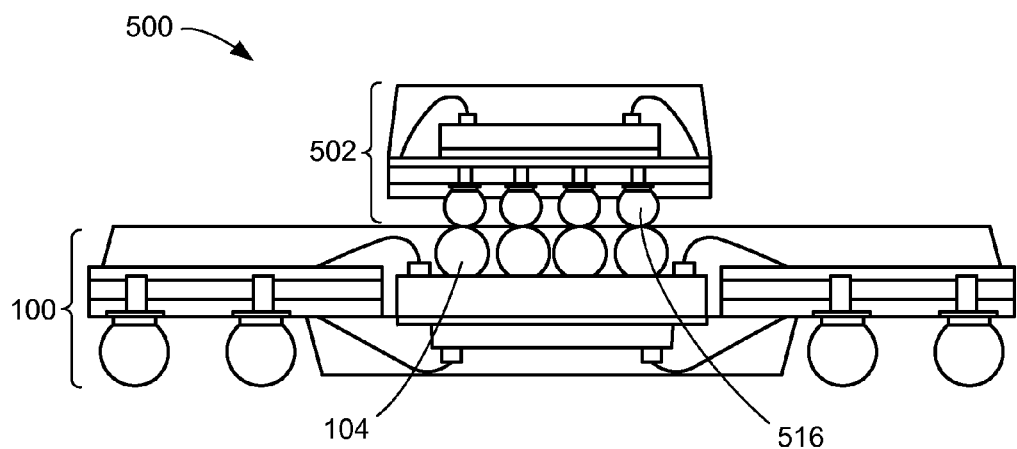
FIG. 14 is the structure of FIG. 13 in a package mounting phase.

Referring now to FIG. 14, therein is shown the structure of FIG. 13 in a package mounting phase. The top package 502 is mounted on the first stackable integrated circuit package system 100 forming the first integrated circuit package-on-package system 500. The first interconnects 104 and the top external interconnects 516 may be a number of configurations, such as a peripheral configuration, an array configuration, a configuration with depopulated locations, or a combination thereof. More than one package or packages of different types may be mounted on a stackable integrated circuit package system, such as the first stackable integrated circuit package system 100.

Figure 15:
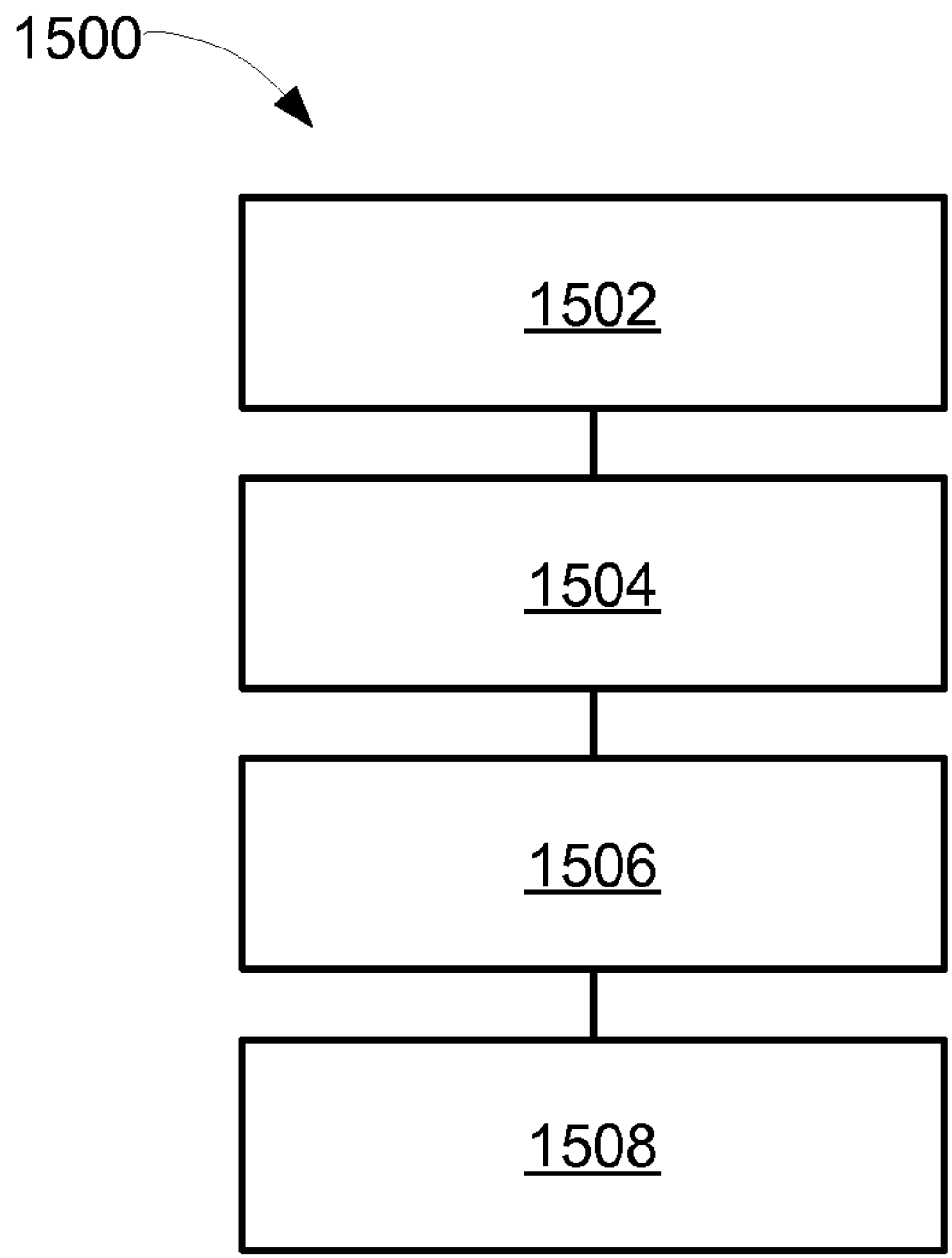
FIG. 15 is a flow chart of a stackable integrated circuit package system for manufacture of the stackable integrated circuit package system in an embodiment of the present invention.

Referring now to FIG. 15, therein is shown a flow chart of a stackable integrated circuit package system 1500 for manufacture of the stackable integrated circuit package system 100 in an embodiment of the present invention. The system 1500 includes placing a first integrated circuit die having an interconnect provided thereon in a substrate having a cavity in a block 1502; encapsulating the first integrated circuit die, having the interconnect exposed, in the cavity and along a first side of the substrate in a block 1504; mounting a second integrated circuit die to the first integrated circuit die in a block 1506; and encapsulating the second integrated circuit die along a second side of the substrate in a block 1508.

It has been discovered that the present invention thus has numerous aspects.

It has been discovered that the stackable integrated circuit package system provides low cost and flexible manufacturing for increasing integrated circuit content in a minimum space. The use of existing equipments for manufacturing the stackable integrated circuit package offers a low cost manufacturing. The external connectivity options provide various integration and stacking options with known good die (KGD) increasing the overall manufacturing yield to decrease the overall manufacturing cost.

An aspect is that the present invention integrates the bumped devices or stacked bumped devices provides a higher I/O to the next system level, such as a printed circuit board, or more package-on-package configurations while not increasing the overall package size.

Another aspect of the present invention is that the bumps on the bumped devices are molded and may be in a number of configurations, such as a peripheral configuration, an arrayed configuration, a configuration with some depopulated locations, a configuration with different pitches, or a combination thereof. This configuration flexibility allows for different types and multiple stacking options. The configuration may be tailored to match the requirements of the overall package on the mother board.

Yet another aspect of the present invention is that the bumped integrated circuit die may direct signals from the top device to circuitry of the bumped integrated circuit die and subsequently to the printed circuit board (PCB) using flex-on-chip (FOC) technology. The bumped integrated circuit die also provides signal routing from a top device stacked on the stackable integrated circuit package to the PCB (daisy chain) using redistribution layer (RDL) technology serving as a dummy substrate/interposer. The bumped integrated circuit die further provides signal routing from the top device stacked on the stackable integrated circuit package, via bumped integrated circuit die circuitry, to the PCB using RDL technology.

Yet another aspect of the present invention is that the flexibility of integration and stacking options. The stackable integrated circuit package may for numerous stacked integrated circuit package with KGD in the form of bare dies or packaged devices. Also, the stackable integrated circuit package may form numerous package-on-package solutions with KGD in the form of bare dies or packaged devices. Further, the stackable integrated circuit package may form package solutions with a combination of the above mentioned package types, again with all KGD.

Yet another important aspect of the present invention is that it valuably supports and services the historical trend of reducing costs and increasing performance. These and other valuable aspects of the present invention consequently further the state of the technology to at least the next level.

Thus, it has been discovered that the stackable integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A stackable integrated circuit package system comprising:
    a substrate having a first side and a second side opposite the first side, the substrate having a cavity provided therein;
    a first integrated circuit die in the cavity with a first interconnect extending out from the cavity without connection and a second interconnect connected to the first side;
    a first mold compound to cover the first integrated circuit die, the second interconnect, and a portion of the first interconnect;
    a second integrated circuit die mounted to the first integrated circuit die with a third interconnect connected to the second side;
    a second mold compound to cover the second integrated circuit die and the third interconnect; and
    external interconnects, not encapsulated by the second encapsulant, mounted on the second side.

2. The system as claimed in claim 1 wherein the first mold compound to cover the first side.

3. The system as claimed in claim 1 wherein the first mold compound is a center gate mold on the first side.

4. The system as claimed in claim 1 further comprising a third mold compound to surround the first mold compound with the interconnect exposed.

5. The system as claimed in claim 1 wherein the second integrated circuit die has the interconnect provided thereon and the second mold compound exposed the interconnect.

6. The system as claimed in claim 1 wherein:
    the first integrated circuit die having the interconnect provided thereon in the substrate having the cavity is within the cavity;
    the first mold compound to cover the first integrated circuit die, having the interconnect exposed, in the cavity fills the cavity;
    the second integrated circuit die is mounted to a non-active side of the first integrated circuit die;
    the second mold compound to cover the second integrated circuit die to the substrate is attached to the first mold compound; and
further comprising:
    a first bond wire between the first integrated circuit die and a first side of the substrate; and
    a second bond wire between the second integrated circuit die and a second side the substrate.

7. The system as claimed in claim 6 further comprising:
    a top package having a top external interconnect; and
    the top package on the stackable integrated circuit package system with the top external interconnect attached to the interconnect.

8. The system as claimed in claim 6 further comprising:
    a top package having a top external interconnect; and
    the top package on the stackable integrated circuit package system with the top external interconnect attached to the interconnect and the first side.

9. The system as claimed in claim 6 wherein the second mold compound is a center gate mold on the second side.

10. The system as claimed in claim 6 further comprising a hermetic seal formed with the first molding compound and the second molding compound.

* * * * *